(12) United States Patent
Sumi

(10) Patent No.: US 7,553,364 B2
(45) Date of Patent: Jun. 30, 2009

(54) FERROELECTRIC THIN FILM FORMATION COMPOSITION, FERROELECTRIC THIN FILM AND METHOD OF FABRICATING FERROELECTRIC THIN FILM

(75) Inventor: Koji Sumi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/108,283

(22) Filed: Apr. 23, 2008

(65) Prior Publication Data

US 2008/0217574 A1 Sep. 11, 2008

Related U.S. Application Data

(63) Continuation of application No. 10/880,426, filed on Jun. 30, 2004, now abandoned.

(30) Foreign Application Priority Data

Jun. 30, 2003 (JP) ............... 2003-188971
May 25, 2004 (JP) ............... 2004-155242

(51) Int. Cl.
    *C23C 18/00* (2006.01)
(52) U.S. Cl. ............... 106/287.12; 106/287.1; 106/287.11; 106/287.16; 106/287.18; 106/287.19; 427/100; 427/126.3; 427/380; 427/384
(58) Field of Classification Search ............... 106/287.1, 106/287.11, 287.12, 287.16, 287.18, 287.19; 427/100, 126.3, 380, 0.384
See application file for complete search history.

(56) References Cited

U.S. PATENT DOCUMENTS

| 5,180,693 | A | 1/1993 | Lerot et al. |
| 5,397,823 | A | 3/1995 | Torikoshi |
| 2001/0022990 | A1 | 9/2001 | Sato et al. |
| 2003/0000422 | A1 | 1/2003 | Hase et al. |

FOREIGN PATENT DOCUMENTS

| CN | 1267654 A | 9/2000 |
| JP | 2001-48540 A | 2/2001 |
| JP | 2001-72418 A | 3/2001 |
| JP | 2001-213624 | 8/2001 |

*Primary Examiner*—David M Brunsman
(74) *Attorney, Agent, or Firm*—Sterne, Kessler, Golstein & Fox P.L.L.C.

(57) ABSTRACT

Provided are a ferroelectric thin film formation composition, a ferroelectric thin film and a method of fabricating a ferroelectric thin film, the ferroelectric thin film formation composition being capable of effectively preventing occurrence of a striation and expanding the range of choice of a sol composition. A ferroelectric thin film formation composition containing a metal compound that is a material to form a ferroelectric thin film contains a hydrophobic compound which includes a reactive group reacting with a hydroxy group and in which at least an end side of a remnant exclusive of the reactive group has a hydrophobic property. Thus, it is possible to expand the range of choice of the sol composition while effectively suppressing occurrence of the striation.

5 Claims, 5 Drawing Sheets

FERROELECTRIC THIN FILM FORMATION COMPOSITION, FERROELECTRIC THIN FILM AND METHOD OF FABRICATING FERROELECTRIC THIN FILM

CROSS REFERENCE TO RELATED APPLICATIONS

This application is a continuation of U.S. application Ser. No. 10/880,426 filed Jun. 30, 2004 now abandoned, which is hereby incorporated by reference in its entirety.

BACKGROUND OF THE INVENTION

1. Field of the Invention

The present invention relates to a ferroelectric thin film formation composition containing a metal compound to form a ferroelectric thin film, a ferroelectric thin film and a method of fabricating a ferroelectric thin film.

2. Description of the Related Art

A piezoelectric element having a ferroelectric thin film containing a crystal, which is typified by lead-zirconate-titanate (PZT) and the like, has spontaneous polarization, high dielectric constant, an electrooptic effect, a piezoelectric effect, a pyroelectric effect and the like. Thus, the piezoelectric element described above is applied to wide-ranging device development. Moreover, as a method of forming such a ferroelectric thin film, for example, a sputtering method, a sol-gel method, a CVD method and the like are known. Among the above-described methods, the sol-gel method is a method of forming a film by sequentially performing application, drying and calcination of a sol (colloidal solution). Accordingly, the sol-gel method has an advantage that the ferroelectric thin film can be easily formed at relatively low cost. For example, by use of the sol-gel method as described above, the ferroelectric thin film can be formed in the following manner. Specifically, a ferroelectric thin film formation composition (sol) is applied onto a substrate, the ferroelectric thin film formation composition being obtained by dissolving a metal compound such as a metal alkoxide in a solvent such as alcohol and adding an arbitrary additional agent, as the need arises, for adjustment. Thereafter, the sol is dried, degreased and calcined.

However, if the ferroelectric thin film is formed by use of a conventional ferroelectric thin film formation composition, a radially extending uneven striped pattern, that is, a striation occurs in the ferroelectric thin film. Thus, there is a problem that an even ferroelectric thin film cannot be formed. Note that the cause of occurrence of the striation has not been clearly elucidated in the present circumstances.

Accordingly, in order to solve the problem as described above, there has been proposed a ferroelectric thin film formation composition in which a water content in a sol composition is set to a predetermined amount or less (for example, see Japanese Patent Laid-Open No. 2001-48540). However, there is a problem that selection of the composition, for example, use of a compound containing water of crystallization or a compound such as alkoxide, which has a hydroxy group by hydrolysis, is significantly limited.

Moreover, there has been proposed a perovskite oxide thin film formation source solution containing silicon (for example, see Japanese Patent Laid-Open No. 2001-72416). This perovskite oxide thin film formation source solution is intended to eliminate the striation by containing silicon which has chemical stability that a composition of the source solution hardly reacts with organic matter and has very low surface tension.

However, as described above, silicon is chemically stable and never reacts with other compounds. Thus, even if silicon is dried or calcined, silicon remains as it is in the ferroelectric thin film as impurities. Consequently, there arises a problem that the impurities may adversely affect piezoelectric properties.

SUMMARY OF THE INVENTION

In consideration for the circumstances as described above, the object of the present invention is to provide a ferroelectric thin film formation composition, a ferroelectric thin film and a method of fabricating a ferroelectric thin film, the ferroelectric thin film formation composition being capable of effectively preventing occurrence of a striation and expanding the range of choice of a sol composition.

A first aspect of the present invention for achieving the foregoing object is a ferroelectric thin film formation composition containing a metal compound that is a material to form a ferroelectric thin film, characterized in containing a hydrophobic compound which includes a reactive group reacting with a hydroxy group and in which at least an end side of a remnant exclusive of the reactive group has a hydrophobic property.

In the first aspect, the hydroxy group contained in the sol composition and the reactive group of the hydrophobic compound are chemically bonded together to generate hydrophobic colloid. Thus, occurrence of a striation can be effectively prevented. Moreover, compounds including the hydroxy group can be used in a positive manner and the range of choice of the sol composition can be expanded.

A second aspect of the present invention is the ferroelectric thin film formation composition according to the first aspect, characterized in that the reactive group is at least a type of a carboxy group, a silane halide group, a hydroxysilane group, and an alkoxysilane group.

In the second aspect, by use of the ferroelectric thin film formation composition containing the hydrophobic compound having a predetermined reactive group, the occurrence of the striation can be effectively prevented.

A third aspect of the present invention is the ferroelectric thin film formation composition according to one of the first and second aspects, characterized in that diethanolamine is contained as a hydrolysis inhibitor which suppresses hydrolysis of the metal compound.

In the third aspect, hydrolysis of the metal compound can be effectively prevented.

A fourth aspect of the present invention is the ferroelectric thin film formation composition according to any one of the first to third aspects, characterized in that polyethylene glycol is contained as a stabilizer which stabilizes the metal compound.

In the fourth aspect, occurrence of cracks and the like in the ferroelectric thin film can be effectively prevented.

A fifth aspect of the present invention is the ferroelectric thin film formation composition according to any one of the first to fourth aspects, characterized in that 2-butoxyethanol is contained as a solvent to dissolve the metal compound.

In the fifth aspect, the metal compound can be relatively easily dissolved.

A sixth aspect of the present invention is a method of fabricating a ferroelectric thin film, including the steps of: applying the ferroelectric thin film formation composition according to any one of the first to fifth aspects onto a target object; and drying and calcining the ferroelectric thin film formation composition.

In the sixth aspect, by use of a sol-gel method, the striation can be effectively prevented and an even ferroelectric thin film can be relatively easily formed.

A seventh aspect of the present invention is a ferroelectric thin film formed by use of the fabrication method according to the sixth aspect.

In the seventh aspect, by use of the sol-gel method, the striation can be effectively prevented and an even ferroelectric thin film can be relatively easily and surely realized.

The present invention is intended to suppress the striation by allowing the ferroelectric thin film formation composition to contain the hydrophobic compound which forms the hydrophobic colloid by chemically reacting with the hydroxy group considered to be the cause of occurrence of the striation. The present invention is completely different from a conventional technology in which an amount of water is limited or silicon is added.

DESCRIPTION OF THE EMBODIMENT

Figure 1A:
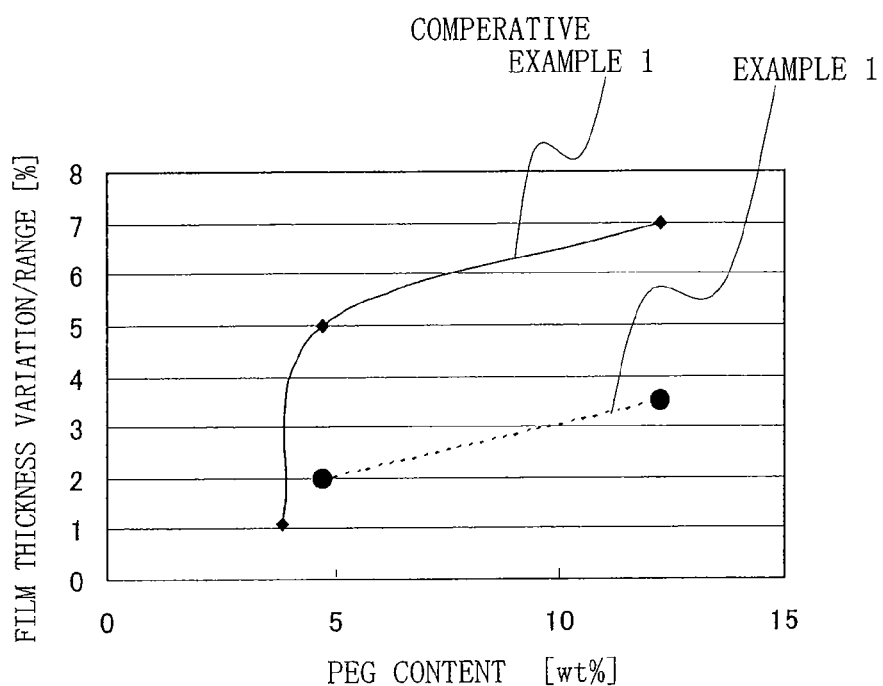
FIGS. 1A and 1B are graphs showing behavior of variation in a film thickness of a ferroelectric thin film.

The present invention will be described in detail below based on an embodiment.

A ferroelectric thin film formation composition according to the present invention is a composition for forming a ferroelectric thin film and is a sol composition containing, as basic components, a metal compound such as metal alkoxide to be a material of the ferroelectric thin film, a solvent to dissolve this metal compound and other additives.

Here, the ferroelectric thin film is crystals of piezoelectric ceramics. As a material to form this ferroelectric thin film, for example, a ferroelectric/piezoelectric material such as lead-zirconate-titanate (PZT), a relaxer ferroelectric substance, which is obtained by adding metal such as niobium, nickel, magnesium, bismuth, ytterbium or the like to the ferroelectric/piezoelectric material, and the like are used. A composition thereof may be accordingly selected in consideration for properties of a piezoelectric element, applications thereof and the like. For example, $PbTiO_3$ (PT), $PbZrO_8$ (PZ), $Pb(Zr_xTi_{1-x})O_3$ (PZT), $Pb(Mg_{1/3}Nb_{2/3})O_3\text{-}PbTiO_3$ (PMN-PT), $Pb(Zn_{1/3}Nb_{2/3})O_3\text{-}PbTiO_3$ (PZN-PT), $Pb(Ni_{1/3}Nb_{2/3})O_3\text{-}PbTiO_3$ (PNN-PT), $Pb(In_{1/2}Nb_{1/2})O_3\text{-}PbTiO_3$ (PIN-PT), $Pb(Sc_{1/3}Ta_{1/2})O_3\text{-}PbtiO_3$ (PST-PT), $Pb(Sc_{1/3}Nb_{1/2})O_3\text{-}PbTiO_3$ (PSN-PT), $BiScO_3\text{-}PbTiO_3$ (BS-PT), $BiYbO_3\text{-}PbTiO_3$ (BY-PT) and the like can be cited.

Although a method of forming a film by use of the ferroelectric thin film formation composition of the present invention is not particularly limited, it is preferable to adopt a sol-gel method, for example. This is because the ferroelectric thin film can be easily formed at relatively low cost.

Here, the metal compound that is the material to form the ferroelectric thin film may be accordingly selected depending on a film formation method to be adopted. For example, alkoxide, such as methoxide, ethoxide, propoxide and butoxide, of metal such as titanium, zirconium, lead and zinc, an acetate compound and the like can be cited.

Meanwhile, as the solvent to dissolve such a metal compound, for example, alcohol such as 2-butoxyethanol and propyl alcohol can be cited. Moreover, in the present invention, as a hydrolysis inhibitor which suppresses hydrolysis of the metal compound contained in the sol composition, for example, monoethanolamine, diethanolamine, triethanolamine and the like may be added as additives. Furthermore, as a stabilizer which stabilizes the metal compound contained in the sol composition and prevents occurrence of cracks, for example, polyethylene glycol and the like may be added as additives. Moreover, besides those described above, a thickener and the like may be added as additives.

Accordingly, the ferroelectric thin film formation composition of the present invention is one obtained by adding a hydrophobic compound as an essential component to the components described above. Specifically, the hydrophobic compound includes a reactive group which reacts with a hydroxy group and at least an end side of a remnant exclusive of the reactive group has a hydrophobic property.

The hydrophobic compound described above is, for example, a compound including a reactive group which reacts with a hydroxy group at one end of a molecular chain. In addition, the other end thereof has a hydrophobic property. The hydrophobic compound may be one which has the outside showing the hydrophobic property when the reactive group reacts with the hydroxy group and forms hydrophobic colloid, for example. Note that, here, the hydroxy group means one derived from moisture contained in the sol composition, water of crystallization or the like, one derived from hydrolyzed alkoxide and, furthermore, one derived from diethanolamine, polyethylene glycol and the like as the additives described above.

Meanwhile, as the reactive group of the hydrophobic compound, for example, a carboxy group, a silane halide group, a hydroxysilane group, an alkoxysilane group and the like can be cited. Note that the silane halide group is one expressed by —Si—X (X indicates halogen), the hydroxysilane group is one expressed by —Si—OH and the alkoxysilane group is one expressed by —Si—OR (R indicates an alkyl group). Note that the reactive group may be one which chemically reacts with the hydroxyl group as described above and may be, for example, an isocyanate group and the like.

Moreover, at least the end of the remnant of the hydrophobic compound exclusive of the reactive group shows the hydrophobic property means that at least the end side thereof shows the hydrophobic property in a state where the reactive group reacts with the hydroxy group. It is preferable that the remnant of the molecular chain shows the hydrophobic property. For example, a hydrocarbon radical of which remnant exclusive of the reactive group is a straight chain or branched or one in which an amino group exists in a molecular chain of hydrocarbon or at an end thereof can be cited. However, one in which a hydrophobic group such as an alkyl group and an amino group exists at least at the end may be used.

Note that the hydrophobic compound used in the present invention is not one having any polysiloxane bonds in its molecular chain and, therefore, is differentiated from a silicon compound.

Since the ferroelectric thin film formation composition of the present invention includes the hydrophobic compound as described above, it is possible to reduce the hydroxy group existing in the sol composition by chemically reacting with and binding with the hydroxy group existing in the composition. Thus, the ferroelectric thin film formation composition of the present invention is considered to be able to effectively prevent occurrence of a striation in the ferroelectric thin film. Specifically, in the composition of the present invention as described above, even if one including the hydroxy group is used as the solvent or the additive or one containing water of crystallization is used as the metal compound, the hydroxy group described above chemically reacts with the reactive group of the hydrophobic compound. Thus, it is possible to effectively prevent the striation. In other words, as the composition, for example, a compound containing water of crystallization and a compound such as alkoxide which is hydrolyzed to include the hydroxy group can be used in a positive manner. Specifically, there is an effect that the range of choice of the sol composition can be expanded in preparation for the ferroelectric thin film formation composition.

Furthermore, the present invention is effective in the case of using the relaxer ferroelectric substance to form the ferroelectric thin film. Specifically, the relaxer ferroelectric substance contains a larger amount of the metal compound such as metal alkoxide than PZT, for example. Thus, accordingly, it is necessary to add the additives including the hydroxy group, for example, the hydrolysis inhibitor, the stabilizer and the like in large quantity. For example, PMN-PT and PZN-PT increase a concentration of the additives such as the hydrolysis inhibitor for an amount of Nb (metal alkoxide) to be added. Thus, accordingly, the hydroxy group is increased and the striation is likely to occur. Even in the case described above, in the present invention, the occurrence of the striation can be effectively prevented by adding the hydrophobic compound described above.

Here, the present invention will be described in more detail based on the following example 1 and comparative example 1.

EXAMPLE 1

2-butoxyethanol as a main solvent is mixed with zirconium acetylacetonate (Zr(CH3COCHCOCH3)4) and titanium tetraisopropoxide (Ti((CH3) 2CHO)4) as metal compounds and the mixture is agitated for 20 minutes at room temperature. Next, diethanolamine (HN(CH2CH2OH)2) is added thereto as a hydrolysis inhibitor and, furthermore, an amino silane compound (NH2C2H4NHC3H6Si(OCH3)3) is added thereto as a hydrophobic compound. Thereafter, the mixture is agitated for another 20 minutes at room temperature. Furthermore, lead acetate-3-hydrate (Pb(CH3COO)2.3 H2O) is added to the mixture and heated to 80° C. After the mixture is agitated for 20 minutes in a heated state, the mixture is cooled to room temperature. Thus, a ferroelectric thin film formation composition of example 1 is obtained.

Comparative Example 1

The same composition as that of example 1 except that the amino silane compound is not included in the composition is obtained as a ferroelectric thin film formation composition of comparative example 1.

Test Example 1

A content of the amino silane compound contained in the ferroelectric thin film formation composition of example 1 is set to 10 wt %, contents of diethanolamine contained in the ferroelectric thin film formation compositions of example 1 and comparative example 1 are set to 9.6 wt % and a content of polyethylene glycol is changed. Accordingly, a size of a striation (radially striped pattern) which occurs in a ferroelectric thin film (PZT film) under the conditions described above, that is, film thicknesses of a concave portion (valley) and a convex portion (mountain) are measured, respectively. Thereafter, an average film thickness of the PZT film is calculated based on measured values of the respective film thicknesses and behavior of variation (%) in the film thickness of the PZT film is examined. A result thereof is shown in FIG. 1A. Note that FIG. 1A is a graph showing a relationship between the content of polyethylene glycol and the variation in the film thickness of the ferroelectric thin film.

Note that, here, a surface of a metal layer provided on a surface of a substrate is spin-coated with the ferroelectric thin film formation composition for 10 to 30 seconds at 1000 to 3000 rpm. Thus, a PZT film having a thickness of 1.0 µm is formed. Accordingly, for the PZT films of example 1 and comparative example 1, an elemental analysis by use of, for example, energy dispersive X-rays (EDX), X-ray fluorescence and the like is performed. As a result, about 1.05 [mol] of silicon is detected with respect to about 1.00 [mol] of PZT from the PZT film of example 1, which is considered to be silicon of the amino silane compound contained in the ferroelectric thin film formation composition of example 1. On the other hand, no silicon is detected from the PZT film of comparative example 1. Consequently, it is found out that the PZT films of example 1 and comparative example 1 can be distinguished from each other based on whether or not silicon is detected by the elemental analysis.

Moreover, as a result of examining the behavior of variation in the film thickness of the PZT film, the variation in the film thickness of the PZT film is dramatically increased until the content of polyethylene glycol reaches about 4.7 wt % in comparative example 1, as shown in FIG. 1A. The variation continues to increase gradually after that and reaches about 7% when the content of polyethylene glycol reaches about 12 wt %. Consequently, it is found out that, when the content of polyethylene glycol is increased, the striation is likely to occur.

Meanwhile, in example 1, it is found out that, even if the content of polyethylene glycol reaches about 12 wt %, the variation in the film thickness of the PZT film can be suppressed to about 3.5%. This may be because a reactive group of the amino silane compound and a hydroxy group existing in the sol composition, particularly, a hydroxy group of polyethylene glycol chemically react with each other and the hydroxy group existing in the composition is reduced. Specifically, by use of the composition of example 1, the variation in the film thickness of the PZT film can be reduced to about half or less in comparison with the composition of comparative example 1. Consequently, it is confirmed that, as in the case of example 1, by obtaining the ferroelectric thin film formation composition containing the amino silane compound, the striation can be effectively prevented even if the added amount of polyethylene glycol is increased.

EXAMPLE 2

Figure 1B:
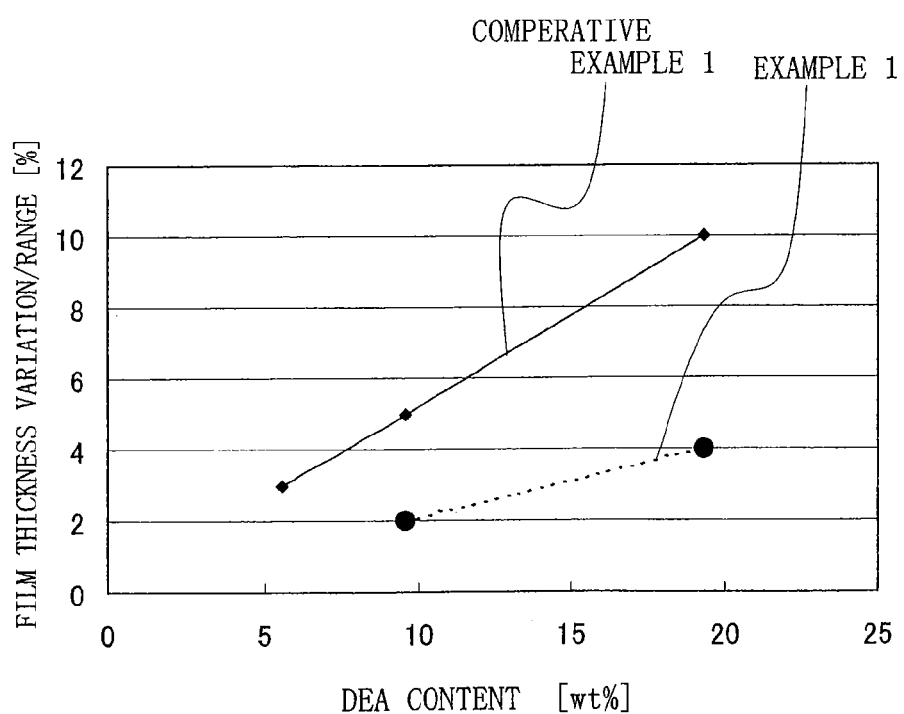

A ferroelectric thin film (PZT film) is formed similarly to that of test example 1 except that the content of the amino silane compound contained in the ferroelectric thin film formation composition of example 1 is set at 10 wt %, the contents of polyethylene glycol contained in the ferroelectric thin film formation compositions of example 1 and comparative example 1 are set at 4.7 wt % and the content of diethanolamine is changed. Thereafter, behavior of variation in a film thickness of the PZT film is examined. A result thereof is shown in FIG. 1B. Note that FIG. 1B is a graph showing a relationship between the content of diethanolamine and the variation in the film thickness of the ferroelectric thin film.

As shown in FIG. 1B, the following is found out about the variation in the film thickness of the ferroelectric thin film. In comparative example 1, when the content of diethanolamine is increased, the variation in the film thickness is increased in proportion thereto. In addition, when the content of diethanolamine is set at about 19 wt %, the variation in the film thickness of the PZT film reaches about 10%.

Meanwhile, in example 1, it is found out that, even if the content of diethanolamine is set at about 19 wt %, the variation in the film thickness of the PZT film can be suppressed to about 4% in comparison with comparative example 1. This may be because the reactive group of the amino silane compound and the hydroxy group existing in the sol composition, particularly, a hydroxy group of diethanolamine chemically react with each other and the hydroxy group existing in the composition is reduced. Specifically, by use of the composition of example 1, as in the case of test example 1 described above, the variation in the film thickness of the PZT film can be reduced to about half or less in comparison with the composition of comparative example 1. Consequently, it is confirmed that, as in the case of example 1, by obtaining the ferroelectric thin film formation composition containing the amino silane compound, the striation can be effectively prevented even if the added amount of diethanolamine is increased.

Note that the ferroelectric thin film formation composition according to the present invention and the ferroelectric thin film formed of the ferroelectric thin film formation composition, which are described above, can be applied to wide-ranging device development and applications thereof and the like are not particularly limited. For example, the composition and the thin film can be applied to a microactuator, a filter, a delay line, a vibrating reed selector, a fork oscillator, a tuning fork clock, a transceiver, a piezoelectric pickup, a piezoelectric earphone, a piezoelectric microphone, a SAW filter, a RF modulator, a resonator, a delay element, a multistrip coupler, a piezoelectric accelerometer, a piezoelectric speaker and the like.

Figure 2:
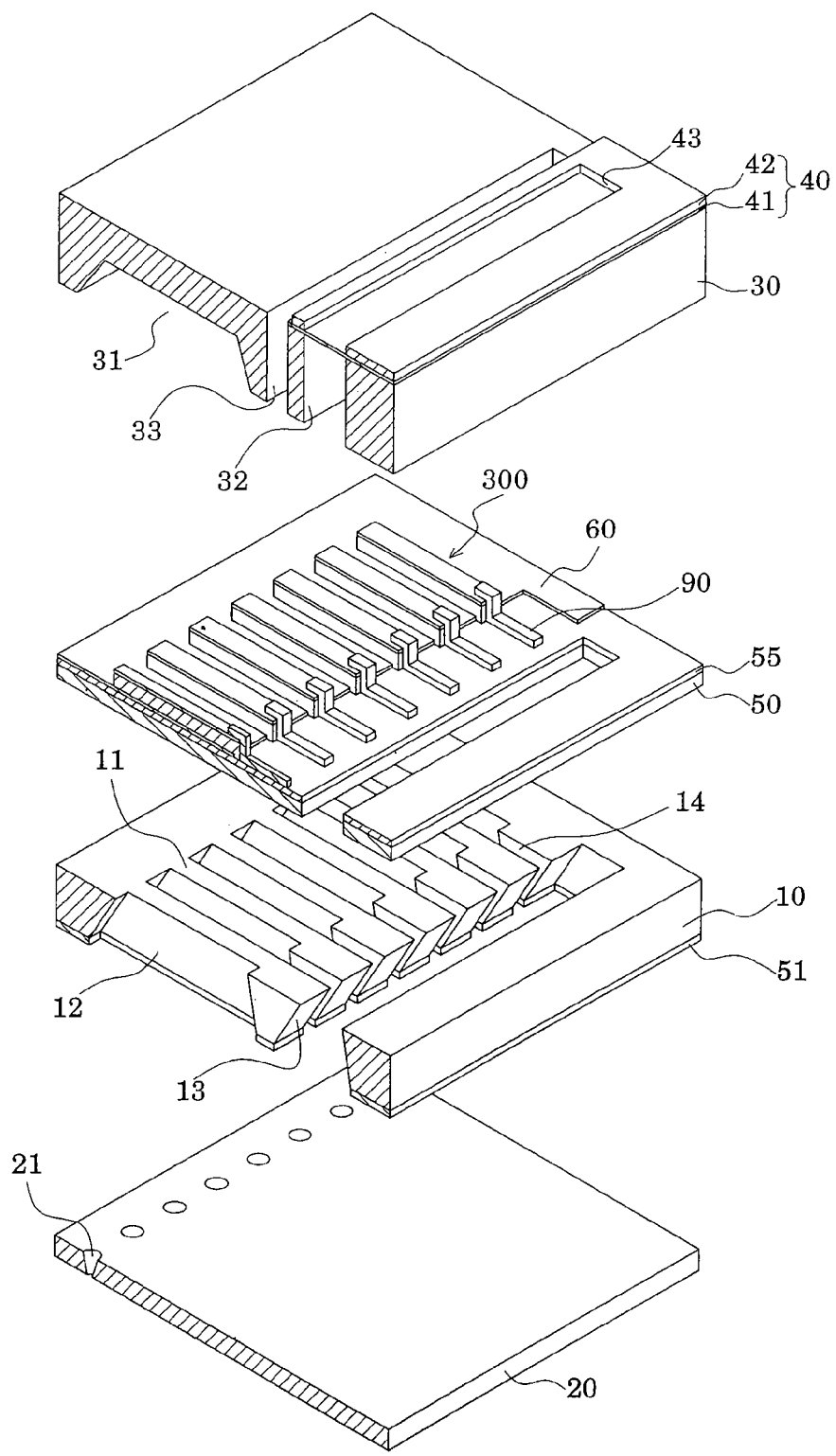
FIG. 2 is a perspective view of an ink-jet recording head.
Figure 3A:
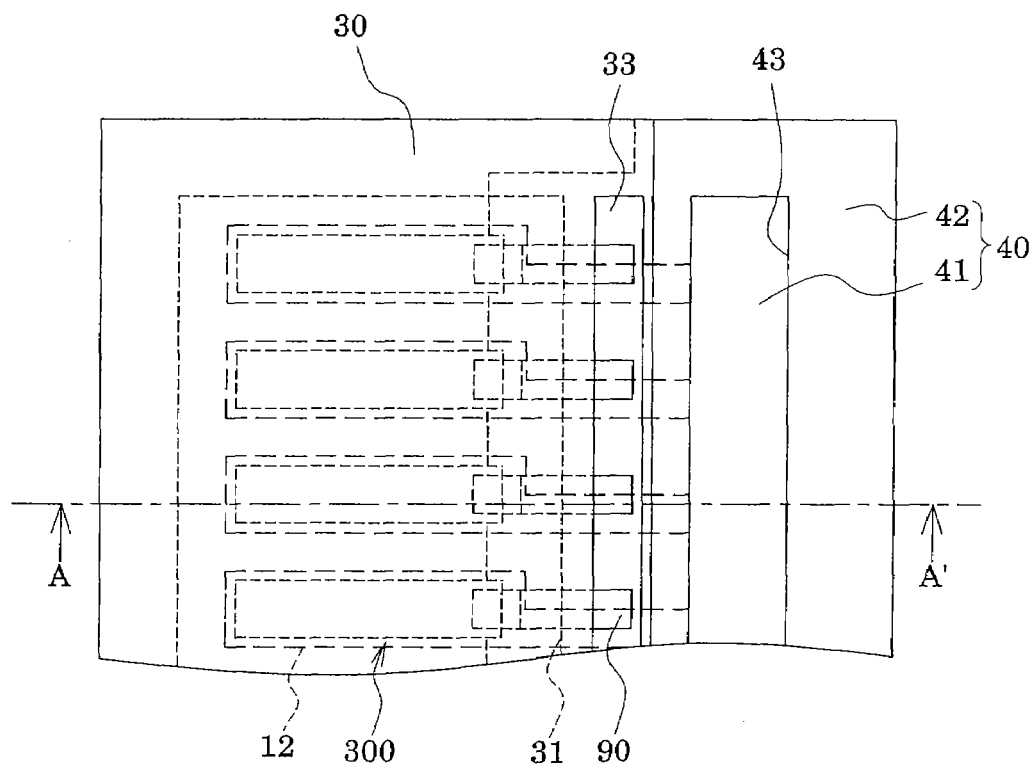
FIGS. 3A and 3B are plan view and cross-sectional view of the ink-jet recording head.
Figure 3B:
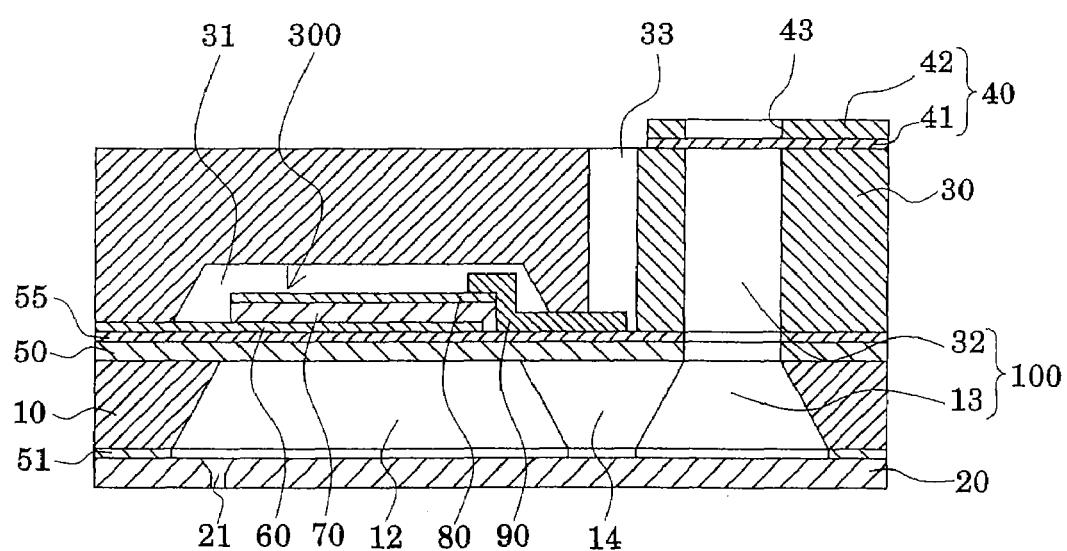

With reference to FIGS. 2 and 3, an ink-jet recording head will be described in detail below, which is an example of a liquid-jet head in which the present invention is applied to a piezoelectric actuator. FIG. 2 is an exploded perspective view schematically showing the ink-jet recording head as one example of the liquid-jet head. FIGS. 3A and 3B are plan view and cross-sectional view of FIG. 2, respectively. As shown in FIGS. 2 and 3, a passage-forming substrate 10 is made of a single crystal silicon substrate of plane orientation (110) in this embodiment and, on one surface thereof, an elastic film 50 with a thickness of 1 to 2 μm, which is made of silicon dioxide (SiO2) previously formed by thermal oxidation, is formed.

In this passage-forming substrate 10, pressure generating chambers 12 are arranged in a width direction of the substrate by performing anisotropic etching of the single crystal silicon substrate from one surface thereof. Specifically, the pressure generating chambers 12 are separated by a plurality of compartment walls 11. Moreover, on the outside in a longitudinal direction of the pressure generating chambers 12, communicating portions 13 are formed, which communicate with reservoir portion 32 of a sealing plate 30 to be described later. The communicating portions 13 communicate with one end portions in the longitudinal direction of the respective pressure generating chambers 12 via ink supply paths 14, respectively. As to a thickness of the passage-forming substrate 10, in which the pressure generating chambers 12 and the like are formed, as described above, it is preferable that an optimum thickness is selected according to the density of the arranged pressure generating chambers 12. For example, in the case of disposing about 180 of the pressure generating chambers 12 per inch (180 dpi), the thickness of the passage-forming substrate 10 is preferably set to about 180 to 280 μm, more preferably set to about 220 μm. Moreover, in the case of relatively densely disposing the pressure generating chambers 12 to have a density of, for example, about 360 dpi, the thickness of the passage-forming substrate 10 is preferably set to 100 μm or less. This is because array density of the pressure generating chambers 12 can be increased while maintaining rigidity of the compartment walls 11 between the adjacent pressure generating chambers 12. As a matter of course, the pressure generating chambers 12 may be densely arranged to have a density of 360 dpi or more, as for example, 600 dpi. Moreover, on an opening face side of the passage-forming substrate 10, a nozzle plate 20 having nozzle orifices 21 drilled therein is fixed by use of an adhesive agent, a thermowelding film or the like, the nozzle orifices 21 communicating with vicinities of end portions of the respective pressure generating chambers 12 at the opposite side of the ink supply paths 14.

Meanwhile, on the elastic film 50 formed on the opposite side to the opening face of the passage-forming substrate 10, an insulation film 55 having a thickness of, for example, about 0.4 μm is formed. On this insulation film 55, a lower electrode film 60 having a thickness of, for example, about 0.2 μm, a ferroelectric thin film (piezoelectric layer) 70 having a thickness of, for example, about 1 μm and an upper electrode film 80 having a thickness of, for example, about 0.05 μm are laminated by a process to be described later to constitute a piezoelectric element 300. Here, the piezoelectric element 300 means a part including the lower electrode film 60, the ferroelectric thin film 70 and the upper electrode film 80. In general, the piezoelectric elements 300 are constituted by using any one of the electrodes thereof as a common electrode and patterning the other electrode and the ferroelectric thin film 70 for each of the pressure generating chambers 12. Consequently, here, a part which includes any one of the electrodes, that is patterned, and the ferroelectric thin film 70 and in which piezoelectric strain occurs due to voltage application to the both electrodes is called a piezoelectric active portion. In this embodiment, the lower electrode film 60 is used as the common electrode of the piezoelectric element 300 and the upper electrode film 80 is used as an individual electrode thereof. However, even if this order is reversed because of a drive circuit and wiring, there is no trouble caused thereby. In any case, the piezoelectric active portion is formed in each of the pressure generating chambers 12. Moreover, here, the piezoelectric element 300 and a vibration plate displaced by drive of the piezoelectric element 300 are collectively called a piezoelectric actuator. Note that, in this embodiment, the elastic film 50, the insulation film 55 and the lower electrode film 60 function as the vibration plate.

To the passage-forming substrate 10 on the piezoelectric elements 300 side, a sealing plate 30 having a piezoelectric element holding portion 31 is joined. Specifically, the piezoelectric elements 300 holding portion 31, in a state of securing a space without inhibiting movement of the piezoelectric elements 300, can seal the space. The piezoelectric elements 300 are sealed in this piezoelectric elements 300 holding portion 31. Furthermore, in the sealing plate 30, the reservoir portion 32 constituting at least a part of a reservoir 100 to be a common ink chamber of the respective pressure generating chambers 12 is provided. This reservoir portion 32 constitutes the reservoir 100 to be the common ink chamber of the respective pressure generating chambers 12 by communicating with the communicating portion 13 of the passage-forming substrate 10 as described above. Moreover, in a region between the piezoelectric elements 300 holding portion 31 and reservoir portion 31 of the sealing plate 30, a through-hole 33 penetrating the sealing plate 30 in its thickness direction is provided. Accordingly, vicinities of end portions of lead electrodes 90 extracted from the respective piezoelectric elements 300 are exposed in the through-holes 33.

Furthermore, on the sealing plate 30 as described above, a compliance plate 40 including a sealing film 41 and a fixed plate 42 is joined. Moreover, the fixed plate 42 is formed by use of a hard material such as metal. A region of this fixed plate 42 corresponding to the reservoir 100 is an opening portion 43 which is obtained by entirely removing the fixed plate 42 in the region in its thickness direction. Thus, the one surface of the reservoir 100 is sealed by use of only the sealing film 41 having flexibility.

In the ink-jet recording head as described above, ink is supplied from unillustrated external ink supply means and the ink is filled inside from the reservoir 100 up to the nozzle orifices 21. Thereafter, in accordance with a drive signal from an unillustrated drive circuit (drive IC), drive voltages are applied between the respective lower and upper electrode films 60 and 80 corresponding to the pressure generating chambers 12. Accordingly, the elastic film 50, the insulation film 55, the lower electrode film 60 and the ferroelectric thin film 70 are subjected to flexible deformation. Thus, pressures in the respective pressure generating chambers 12 are increased and ink droplets are ejected from the nozzle orifices 21.

FIGS. 4 and 5 are cross-sectional views in the longitudinal direction of the pressure generating chamber 12. With reference to FIGS. 4 and 5, a method of manufacturing the ink-jet recording head of this embodiment will be described below. First, as shown in FIG. 4A, a wafer of a single crystal silicon substrate to be the passage-forming substrate 10 is thermally-oxidized in a diffusion furnace heated to about 1100° C. and the elastic film 50 made of silicon oxide is formed all over the wafer. Thereafter, the insulation film 55 made of zirconium oxide (ZrO2) and the like is formed on the insulation film 50. Next, as shown in FIG. 4B, after the lower electrode film 60 is formed on the entire surface of the insulation film 55, the lower electrode film 60 is patterned to have a predetermined shape. Here, for example, the lower electrode film 60 is formed by laminating at least platinum and iridium on the surface of the insulation film 55.

Figure 4A:
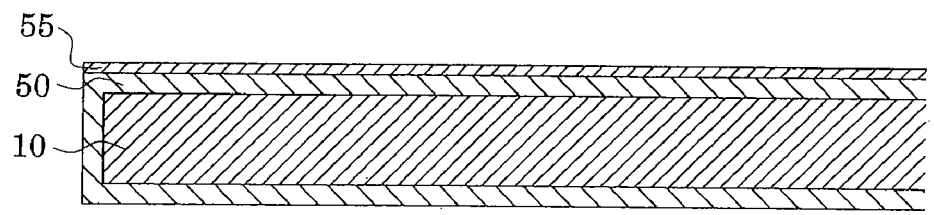
FIGS. 4A to 4D are cross-sectional views showing steps of manufacturing the ink-jet recording head.
Figure 4B:
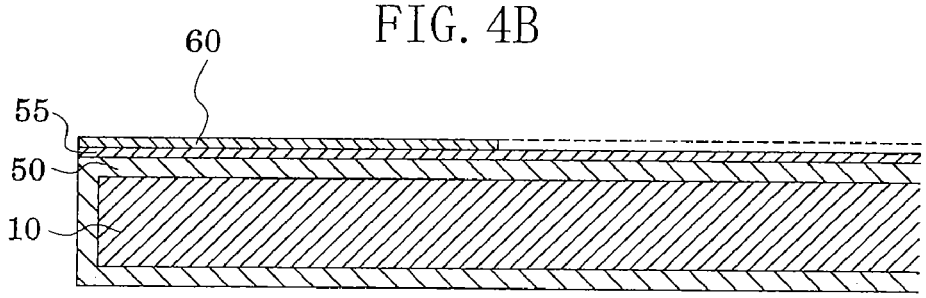
Figure 4C:
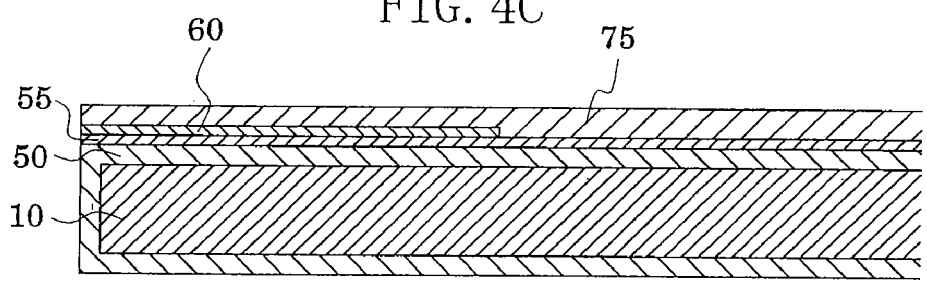

Next, as shown in FIG. 4C, on the entire surface of the water, a ferroelectric formation film (layer) 75 to be the ferroelectric thin film 70 constituting each piezoelectric elements 300 is formed to have a predetermined thickness. In this embodiment, a so-called sol-gel method is used to form the ferroelectric formation film 75 made of metal oxide in such a manner that a ferroelectric thin film formation composition obtained by being bonded to a hydroxy group and allowed to contain a specific compound to form hydrophobic colloid is applied and dried to obtain a gel and the gel is further calcined at a temperature as high as 600 to 800° C. Thus, the ferroelectric formation film 75 having oriented crystals is obtained. Note that the sol-gel method is a method of forming a film by sequentially performing application, drying, degreasing and calcination of a sol. The sol-gel method is used here because the method has an advantage that the ferroelectric thin film can be easily formed at relatively low cost. Note that, when a desired film thickness is not achieved after the first time of application of the sol, application and drying may be performed more than once and, thereafter, degreased and calcined. Here, the sol is dried after the application thereof, in order to remove a solvent contained in the film. In addition, the sol is calcined in order to hydrolyze the metal compound to be converted into composite oxide.

To be more specific, a lead-zirconate-titanate (PZT) film that is a ferroelectric substance is deposited to have a predetermined thickness, which is about 0.2 μm in this embodiment, on the lower electrode film 60 of the wafer. Thus, the PZT film (ferroelectric precursor film) is formed. The thickness of the PZT film obtained by performing deposition once is about 0.1 μm. Thus, in this embodiment, the PZT film having a thickness of about 0.2 μm is formed by performing deposition twice. Next, this wafer is calcined in the diffusion furnace to crystallize the PZT film. Accordingly, a deposition step of depositing the PZT film as described above and a calcinations step of calcining the PZT film are repeated more than once, which is 5 times in this embodiment. Thus, the ferroelectric thin film 70 is formed to have a thickness of about 1 μm. As a matter of course, the ferroelectric formation film may be formed by performing the calcinations step once after performing the deposition step more than once.

As described above, in this embodiment, the ferroelectric formation film 75 is formed on the lower electrode film 60 by the sol-gel method using the ferroelectric thin film formation composition. Thus, the hydroxy group contained in the composition can be reduced and the striation can be effectively prevented.

Moreover, a conventional sol composition has bad adhesion properties to the passage-forming substrate. Thus, there was a problem that, when the substrate is tilted or set upright after application thereof, the sol composition flows out of the substrate. Meanwhile, in this embodiment, there is an advantage that the sol composition does not flow out of the substrate even if the passage-forming substrate is set upright. This may be because the reactive group of the hydrophobic compound contained in the ferroelectric thin film formation composition reacts with the hydroxy group and viscosity of the sol composition is enhanced. Thus, without setting the substrate in a horizontal position too accurately, the subsequent deposition step can be continuously performed. Consequently, there is an effect that workability of the deposition process can be improved.

Note that, as a material to form the ferroelectric formation film 75 formed as described above, a material of lead-zirconate-titanate is used. However, as a material used in the ink-jet recording head, the material is not limited to the material of lead-zirconate-titanate as long as good displacement properties can be obtained. Specifically, in the case of densely disposing the pressure generating chambers 12 to have a density of, for example, 600 dpi, it is preferable to use the relaxer ferroelectric substance described above. Since this relaxer ferroelectric substance contains a larger amount of the metal compound such as metal alkoxide than PZT, the amount of additives including the hydroxy group is increased. However, in the present invention, by adding the hydrophobic compound described above, the striation can be effectively prevented.

Note that, although the sol-gel method is exemplified as the film formation method in this embodiment, it is needless to say that the method is not limited thereto. As long as a method of forming a ferroelectric thin film, which is accompanied by spin coating, such as MOD (metal-organic decomposition) is used, it is possible to effectively prevent occurrence of the striation and to relatively easily form an even ferroelectric thin film made of the ferroelectric thin film formation composition.

Figure 4D:
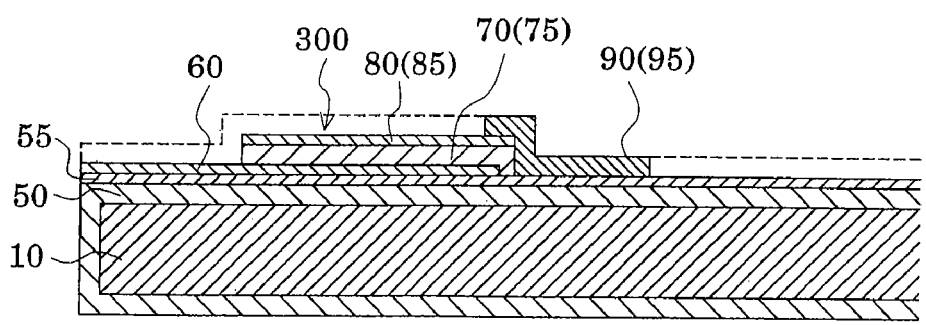

Accordingly, after the ferroelectric thin film 70 is formed as described above, an upper electrode formation film 85 made of, for example, iridium (Ir) is laminated. Thereafter, the ferroelectric formation film 75 and the upper electrode formation film 85 are patterned in regions corresponding to the respective pressure generating chambers 12. Thus, as shown in FIG. 4D, the piezoelectric element 300 including the lower electrode film 60, the ferroelectric film 70 and the upper electrode film 80 is formed. Thereafter, after a lead electrode formation film 95 made of gold (Au) is formed over the entire surface of the passage-forming substrate 10, the lead electrode formation film 95 is patterned for each of the piezoelectric elements 300 by means of a mask pattern (not shown) made of resist and the like, for example. Thus, the lead electrode 90 is formed.

Figure 5A:
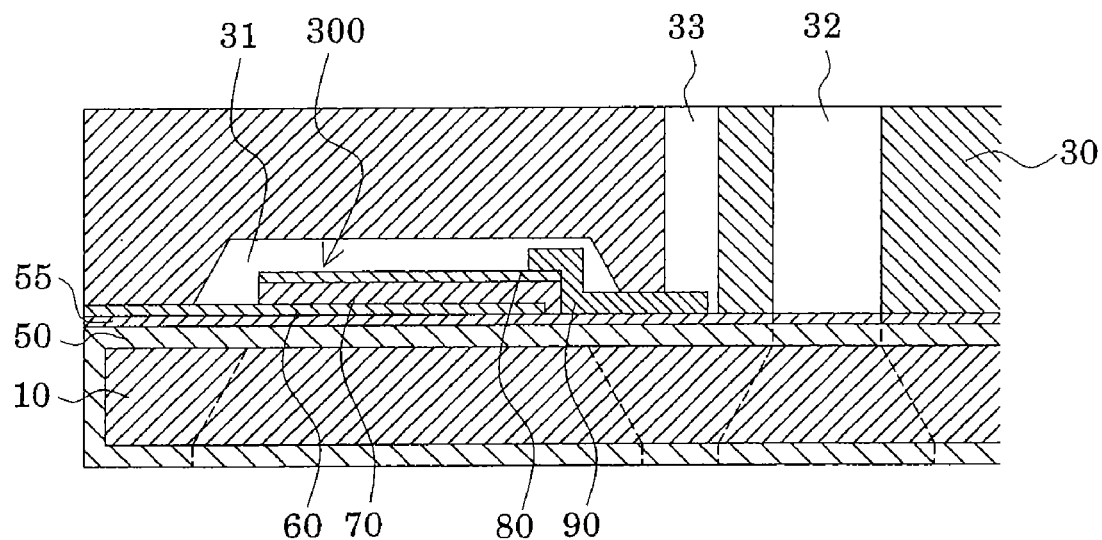
FIGS. 5A and 5B are cross-sectional views showing the steps of manufacturing the ink-jet recording head.
Figure 5B:
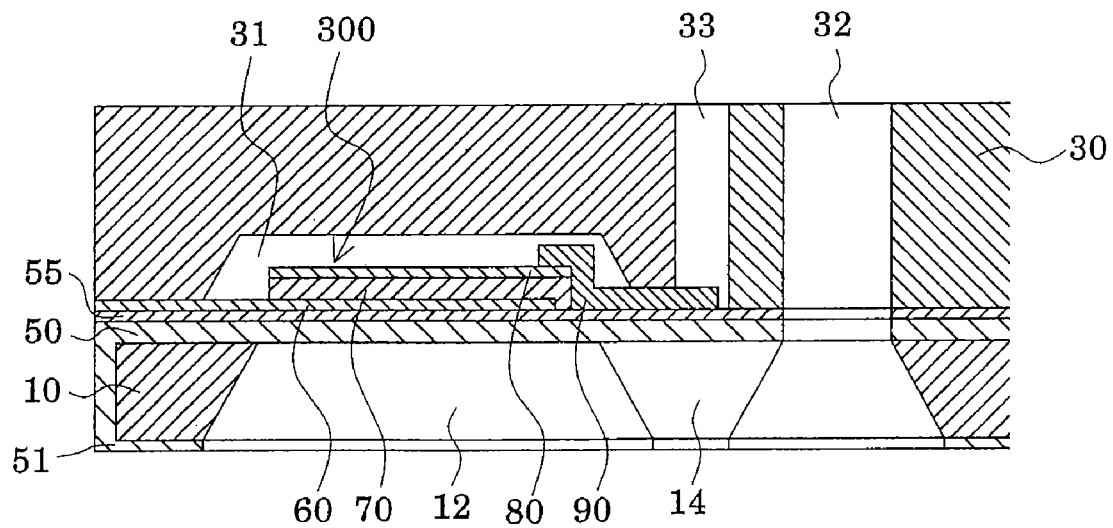

The steps described above are the film formation process. After the film formation is performed as described above, anisotropic etching of the wafer is performed by use of the alkaline solution described above. Thus, the pressure generating chambers 12, the communicating portion 13 and the ink supply paths 14 are formed. Specifically, first, as shown in FIG. 5A, the sealing plate 30 having the piezoelectric elements 300 holding portion 31 and the reservoir portion 32 which are previously formed therein is joined to the piezoelectric elements 300 side of the wafer. Next, as shown in FIG. 5B, the silicon oxide film formed on the opposite surface to the junction surface of the sealing plate 30 of the wafer is patterned to have a predetermined shape and a mask film 51 is obtained. Thereafter, the anisotropic etching with the alkaline solution described above is performed by means of this mask film 51. Thus, the pressure generating chambers 12, the communicating portion 13, the ink supply paths 14 and the like are formed in the wafer. Note that, in performing the anisotropic etching as described above, the anisotropic etching is performed in a state where the surface of the sealing plate 30 is sealed.

Moreover, thereafter, the nozzle plate 20 having the nozzle orifices 21 drilled therein is joined to the opposite surface to the sealing plate 30 of the wafer. In addition, the compliance plate 40 is joined to the sealing plate 30 and the wafer is divided into respective pieces of a chip size. Thus, the ink-jet recording head of this embodiment as shown in FIG. 2 is obtained.

Note that, in this embodiment, the description was made by using the ink-jet recording head which ejects ink as an example of the liquid-jet head. However, without being limited thereto, other liquid-jet heads can be cited, including, for example: a recording head used in an image recording apparatus such as a printer; a color material jet head used for manufacturing color filters of a liquid crystal display and the like; an electrode material jet head used for forming electrodes of an organic EL display, a field emission display (FED) and the like; a bio-organic matter jet head used for manufacturing biochips; and the like.

What is claimed is:

1. A ferroelectric thin film formation composition comprising a metal compound that is a material to form a ferroelectric thin film, and a hydrophobic compound which includes a reactive group reacting with a hydroxy group and wherein at least an end side of a remnant exclusive of the reactive group has a hydrophobic property, and the reactive group has a silane group.

2. The ferroelectric thin film formation composition according to claim 1, wherein the reactive group is at least a type of a silane halide group, a hydroxysilane group and an alkoxysilane group.

3. The ferroelectric thin film formation composition according to claim 1, further comprising diethanolamine as a hydrolysis inhibitor which suppresses hydrolysis of the metal compound.

4. The ferroelectric thin film formation composition according to claim 1, further comprising polyethylene glycol as a stabilizer which stabilizes the metal compound.

5. The ferroelectric thin film formation composition according to claim 1, further comprising 2-butoxyethanol as a solvent to dissolve the metal compound.

* * * * *